(12) United States Patent
Muto

(10) Patent No.: US 7,232,723 B2
(45) Date of Patent: Jun. 19, 2007

(54) METHOD OF FABRICATING SEMICONDUCTOR DEVICE

(75) Inventor: Koki Muto, Miyagi (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 11/493,591

(22) Filed: Jul. 27, 2006

(65) Prior Publication Data

US 2006/0263982 A1 Nov. 23, 2006

Related U.S. Application Data

(62) Division of application No. 10/747,171, filed on Dec. 30, 2003, now Pat. No. 7,105,407.

(30) Foreign Application Priority Data

May 16, 2003 (JP) .............................. 2003-138857

(51) Int. Cl.
*H01L 21/8247* (2006.01)
(52) U.S. Cl. ................ 438/257; 438/593; 257/E21.179
(58) Field of Classification Search ........ 438/257–267, 438/593–594; 257/E21.179
See application file for complete search history.

(56) References Cited

U.S. PATENT DOCUMENTS

| 5,255,219 A | 10/1993 | Sakai |
| 5,310,693 A * | 5/1994 | Hsue .......................... 438/262 |
| 5,747,848 A | 5/1998 | Yoo et al. |
| 6,362,052 B1 | 3/2002 | Rangarajan et al. |
| 6,458,656 B1 | 10/2002 | Park et al. |
| 6,537,724 B1 | 3/2003 | Lee et al. |
| 2003/0000920 A1 | 1/2003 | Lee |

FOREIGN PATENT DOCUMENTS

| JP | 03-225965 | 10/1991 |
| JP | 09-186304 | 7/1997 |
| JP | 11-119443 | 4/1999 |
| JP | 11-121638 | 4/1999 |
| JP | 2000-056476 | 2/2000 |
| JP | 2003-086493 | 3/2003 |
| JP | 2003-133295 | 5/2003 |

* cited by examiner

*Primary Examiner*—Richard A. Booth
(74) *Attorney, Agent, or Firm*—Rabin & Berdo, PC

(57) ABSTRACT

There is provided a method of fabricating a semiconductor device comprising the steps of applying resist to a polysilicon film formed across the surface of a substrate and forming a plurality of openings in a resist pattern, for determining a spacing between floating gates adjacent to each other, causing the openings of the resist pattern to undergo uniform contraction by use of, for example, deformation due to thermal flow to thereby form other openings, and etching portions of the polysilicon film, in the openings as contracted to thereby form the floating gate on both sides of the respective openings as contracted. With the method described, it becomes possible to reduce the spacing between the floating gates adjacent to each other above the resolution limit of an exposure system, thereby enlarging a floating gate width.

5 Claims, 12 Drawing Sheets

METHOD OF FABRICATING SEMICONDUCTOR DEVICE

This is a Divisional of U.S. application Ser. No. 10/747,171, filed Dec. 30, 2003, now issued as U.S. Pat. No. 7,105,407, the subject matter of which is incorporated herein by reference.

FIELD OF THE INVENTION

The invention relates to a method of fabricating a semiconductor device, in particular, a method of forming a resist pattern suitable for photolithography used in the step of fabricating a memory (memory device).

BACKGROUND OF THE INVENTION

In the fabrication of a semiconductor device, in particular, a memory, memory cells thereof are formed by use of a grid-like repetitive pattern in order to attain higher density of the memory cells. There is broadly described hereinafter a resist pattern for use in the steps of forming floating gates and control gates in the process of fabricating, for example, an EEPROM (Electrically Erasable Programmable ROM) with reference to FIGS. 9 through 11.

First, a gate oxide 211 and polysilicon film (not shown) are ⅙ formed in that order on the entire top surface of a substrate 201 with an isolation oxide film 210 formed thereon. Subsequently, a striped resist pattern having spacing portions 203 where a resist is removed and left-out portions 204 where the resist remains, as shown in FIG. 9, is transferred by photolithography to a memory cell section in its entirety in order to form end faces of the floating gates, in one direction, on the polysilicon film. In this case, a positive resist is used for the resist by way of example.

The polysilicon film is etched by using the striped resist pattern formed across the memory cell section as a mask. A width of respective portions of the polysilicon film, thus left out without being etched, determines a width of the respective floating gates, along the longitudinal direction thereof, corresponding to a direction in which respective control gates are extended. Thereafter, an insulating film 213, and an electrode polisilicon (not shown) serving as control gates 221 are sequentially formed across the surface of the memory cell section, and subsequently, a resist pattern shown in FIG. 10 is transferred thereto by photolithography. The electrode polisilicon is etched by use of left-out portions 206 of the resist pattern as masks, thereby forming the control gates 221.

Further, in order to form the floating gate 220 under the respective control gates 221, the polysilicon film is etched by use of the control gates 221 as masks, whereupon the floating gates 220 are formed. Thereafter, the formation of regions for a source 223 and drain 224, respectively, metallization, and so forth are performed, thereby completing each of the memory cells. FIG. 11A is a schematic plan view of the memory cell section after the fabrication of the memory cells, and FIG. 11B is a schematic sectional view of the memory cell, taken on line C—C in FIG. 11A.

Herein, write operation is described with reference to FIG. 11B. Assuming that a voltage applied to the control gate 221 is Vpp, capacitance between the floating gate 220 and an active layer 202 is Cu, capacitance between the floating gate 220 and the control gate 221 is Cd, and charge inside the floating gate 220 is Qf, a voltage Vfg of the floating gate 220 can be expressed by the following equation:

$$Vfg = \{Vpp/(1+Cd/Cu)\} + Qf/(Cd+Cu)$$

Prior to the write operation, the second term of the equation is negligible as compared with the first term, and Cu is at a large value in comparison with Cd, so that Vfg becomes a voltage sufficient for inducing a channel, whereupon all memory cell transistors are turned into the "on" state.

At this point in time, if a predetermined voltage is applied between the drain 224 and source 223 of the memory cell where a program is executed, large current flows through the channel, and channel electrons having high energy are injected into the floating gate after passing over a barrier of the gate oxide, in the vicinity of the drain, whereupon the write operation is executed. As is evident from the equation for Vfg, the higher a Cu/Cd ratio is, the more write efficiency is enhanced. Accordingly, it will lead to enhancement in the write efficiency to enlarge an area of the floating gate, opposite to the control gate.

In FIG. 11A, the floating gate 220 is defined by a gate size 232 and a floating gate width 233. Since the gate size 232 is decided upon by a speed, and so forth, as set when designing a device, alteration thereof is not possible, however, since the floating gate width 233 is defined by the resist pattern for etching the polysilicon film, formed after depositing polysilicon across the top surface of the substrate, as previously described, it is conceivable to enlarge the floating gate width 233.

Nevertheless, a spacing between the floating gates 220 adjacent to each other has already been rendered minute in dimension, dependent on the resolving power of the photolithography, so that it is not possible to further narrow down the spacing. Accordingly, it has been difficult to expand the floating gate width 233, and consequently, it has been impossible to enlarge the area of the floating gate, opposite to the control gate.

Now, techniques for causing the resist to undergo deformation by use of thermal flow treatment to thereby form a resist pattern with dimensions less than the resolution limit of a pattern exposure system, or to control the deformation have been disclosed in a Patent Document as described below. With the use of the thermal flow treatment, it is possible to narrow down the spacing between the floating gates adjacent to each other. As with the case of the conventional techniques, after a polysilicon film is formed across the top surface of a substrate and a striped resist pattern is transferred to a memory cell section in its entirety, the thermal flow treatment is applied so as to cause thermal sagging, thereby causing dimensions of spacing portions of the resist pattern to be reduced. That is, a problem due to the resolution limit of the pattern exposure system can be overcome, thereby enabling the floating gate width 233 to be to enlarged However, with a method of forming a minute resist pattern above the resolution limit of the pattern exposure system by use of the thermal flow treatment as described above, in the case of a resist pattern with stripes formed in a wide range covering the memory cell section in its entirety, since an amount of thermal sagging of the resist is insufficient and uneven, the amount of the thermal sagging of the resist for a memory cell 241 positioned in central parts of a memory cell section differs from that for a memory cell 242 positioned near the edges thereof, and a line of the resist pattern, along the shorter sides thereof, recedes as shown in FIG. 12, so that it has turned out that the method is unsuitable for the formation of the floating gates.

The invention has been developed to resolve the problems described above, encountered by the conventional method of fabricating a semiconductor device, and it is an object of the invention to provide a novel and improved method of fabricating a semiconductor device, capable of enlarging a gate width size of floating gates of a semiconductor memory device, and an area of the floating gate, opposite to the control gate, to thereby enhance write efficiency.

SUMMARY OF THE INVENTION

To that end, the invention provides a method of fabricating a semiconductor device wherein memory cells each having a floating gate are formed, said method comprising the step of applying resist to an electrically conductive film formed across the surface of a substrate and forming a plurality of openings in a resist pattern, for determining a spacing between floating gates adjacent to each other, causing the openings of the resist pattern to undergo uniform contraction by use of, for example, deformation due to thermal flow to thereby form other openings, and etching portions of the an electrically conductive film, in the openings as contracted to thereby form the floating gate on both sides of the respective openings as contracted.

Even if the respective openings has a spacing width thereof substantially corresponding to the resolution limit of a exposure system, the spacing width can be contracted by use of the thermal flow, that is, the spacing between the floating gates adjacent to each other can be reduced, thereby enabling a floating gate width to be enlarged. As a result, an area of the floating gate, opposite to the control gate, can be enlarged, so that write efficiency can be enhanced.

Further, with the conventional resist pattern for the formation of the floating gates, since a large striped pattern used to be formed across a memory cell section in its entirety, effects of contraction in opening width after thermal flow treatment were uneven to respective cells, so that the resist pattern was not applicable for the fabrication of devices. In contrast, with the invention, since there are formed the openings to which uniform thermal sagging occurs, respectively, uniform thermal sagging can occur to the respective openings at the time of the thermal flow treatment, so that uniform deformation in pattern occurs at the respective openings.

A baking temperature is higher than a temperature commonly adopted for the purpose of removal of resist solvent and moisture, and while an amount of resist deformation varies depending on the baking temperature, baking for the formation of the floating gates is preferably performed at around 135° C.

Further, instead of causing the openings of the resist to undergo contraction, use may be made of a method whereby a plurality of openings disposed at a plurality of spots are linked with each other by applying thermal flow treatment. With the thermal flow treatment, not only the openings can be caused to undergo contraction but also a line pattern in strip-like form, formed between the plurality of the openings, can be fluidized and separated, thereby linking the openings together so as to have a minute opening width therebetween. Thus, the opening width less than the resolution limit of the exposure system can be obtained at respective linkage parts, so that a spacing between floating gates adjacent to each other can be reduced, and a floating gate width can be enlarged.

BREIF DESCRIPTION OF THE DRAWINGS

FIG. 1A is a schematic plan view of the resist pattern after development while FIG. 1B is a schematic plan view of the resist pattern after thermal flow treatment;

FIG. 3A is a schematic plan view, and FIG. 3B is a schematic sectional view taken on line A—A in FIG. 3A while FIG. 3C is a schematic sectional view taken on line B—B in FIG. 3A;.

Figure 4:
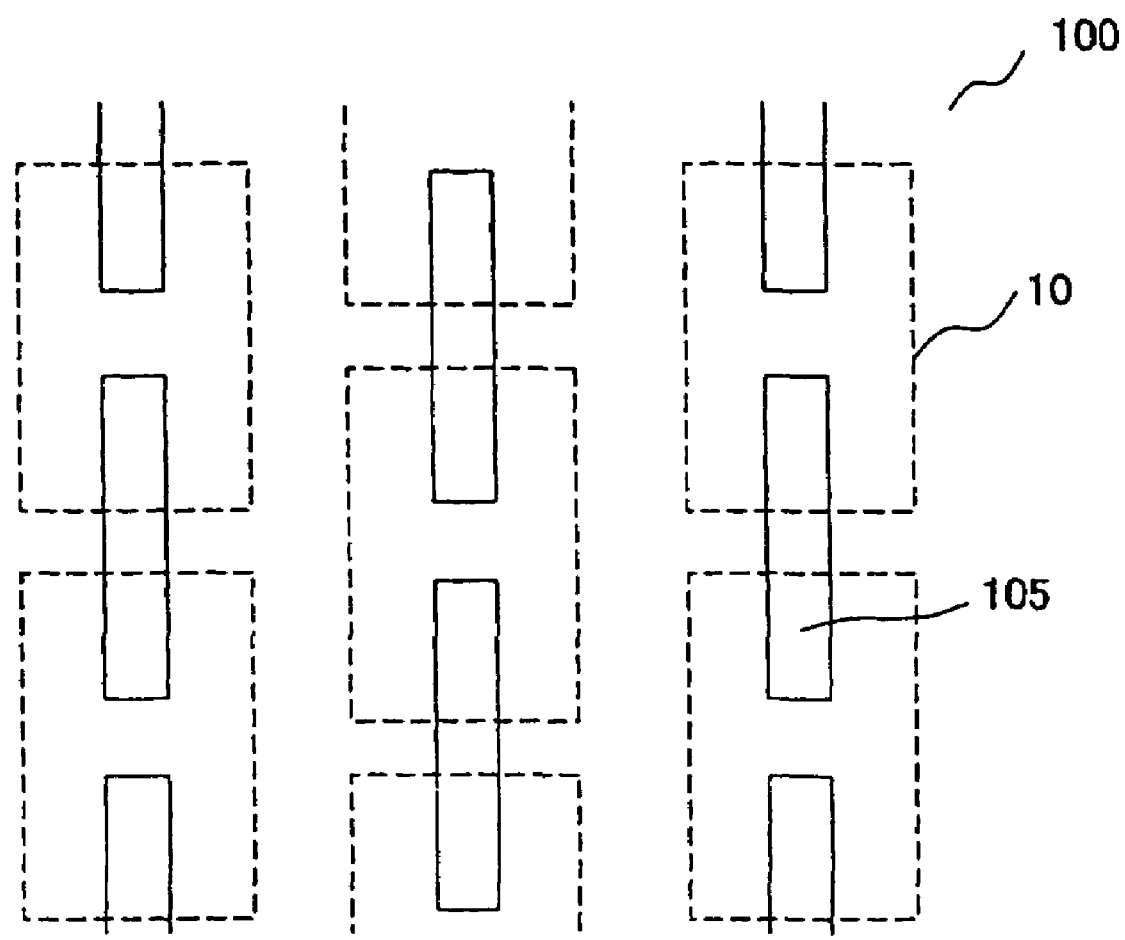
Figure 5A:
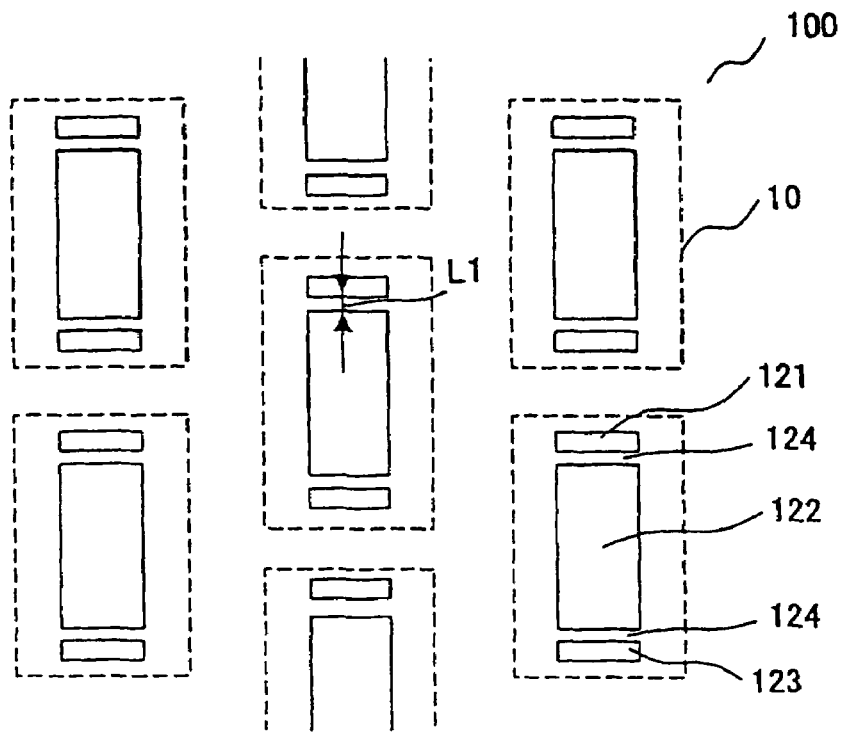
Figure 5B:
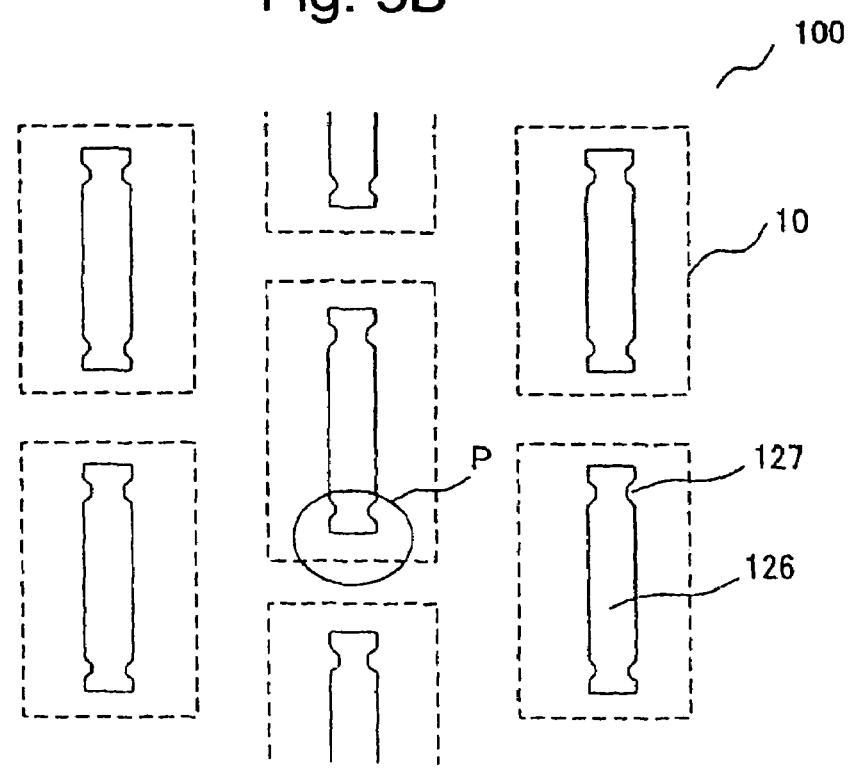
Figure 6:
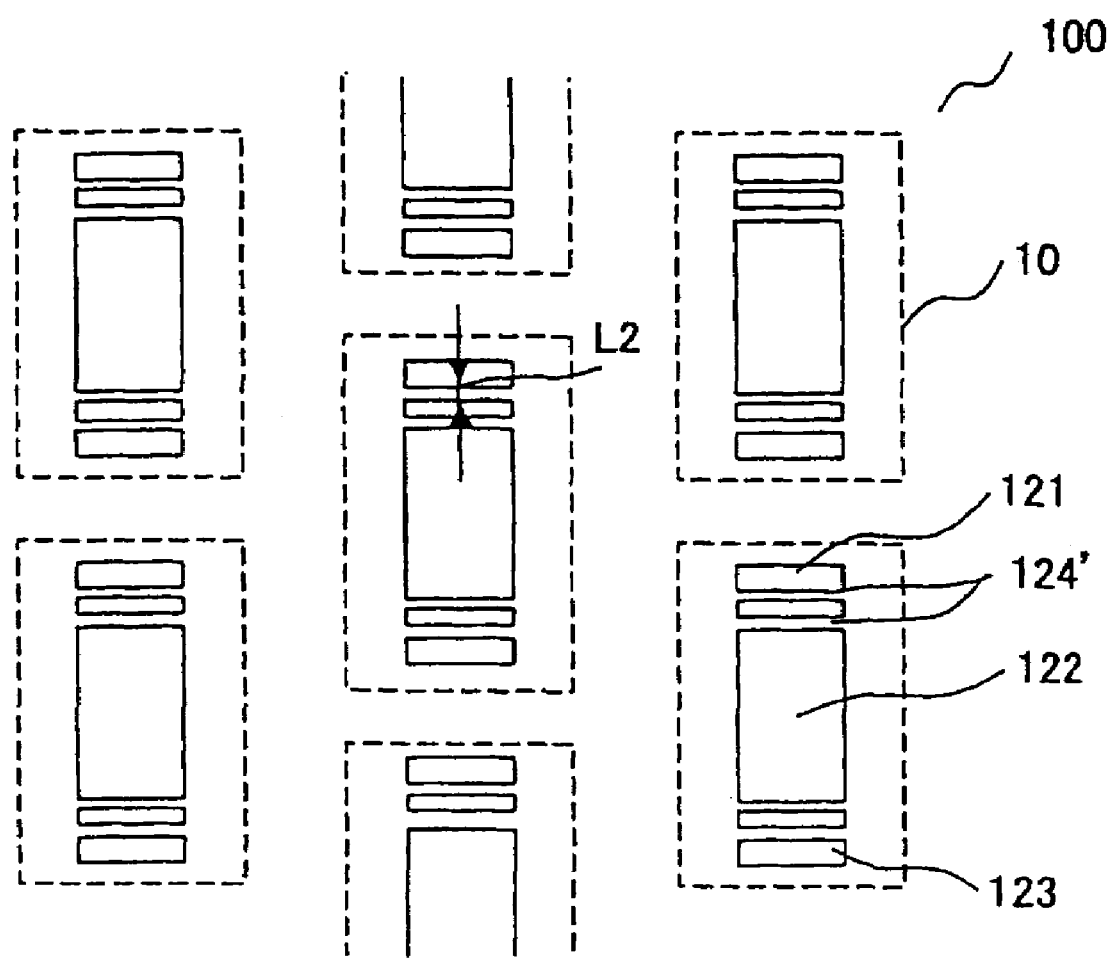
Figure 7:
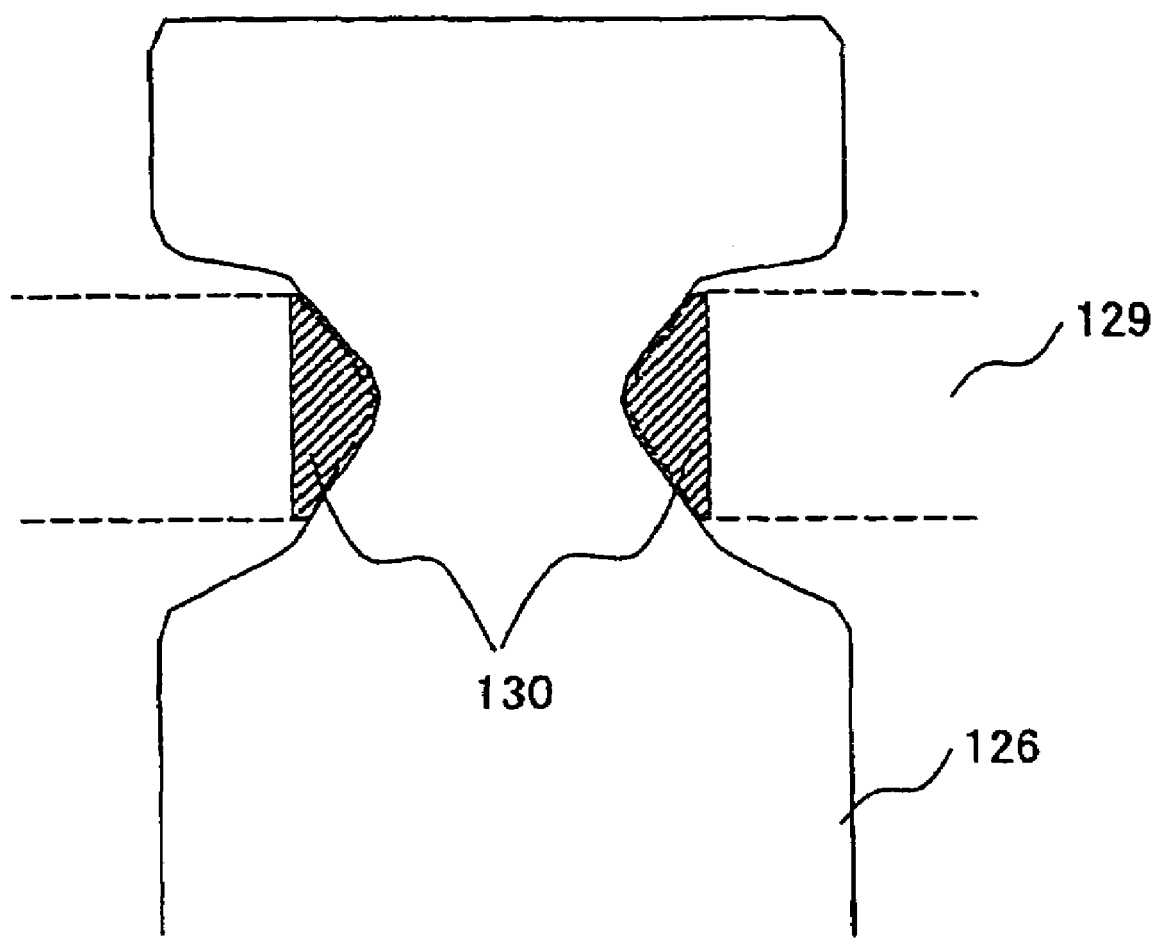
Figure 8A:
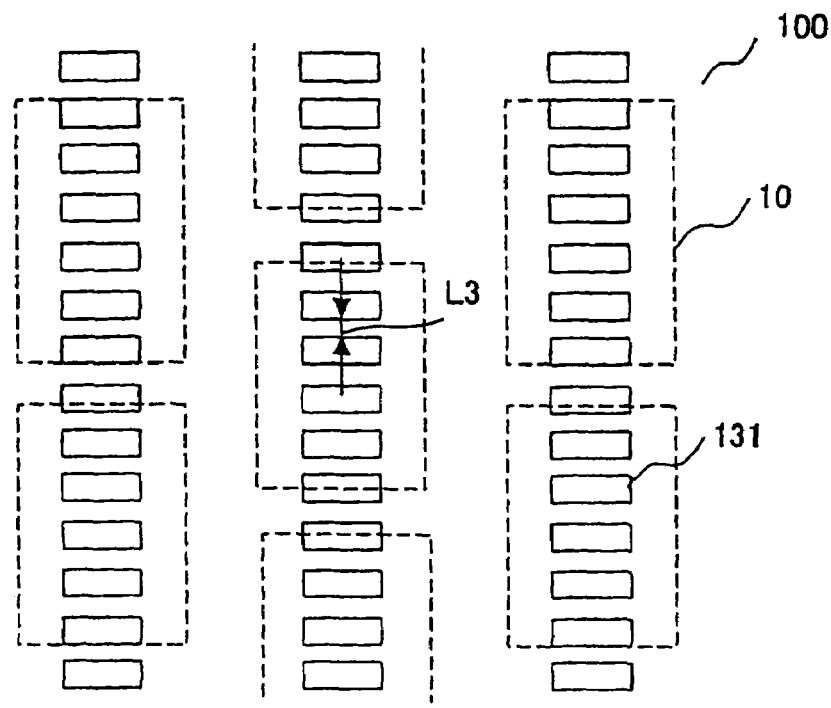
Figure 8B:
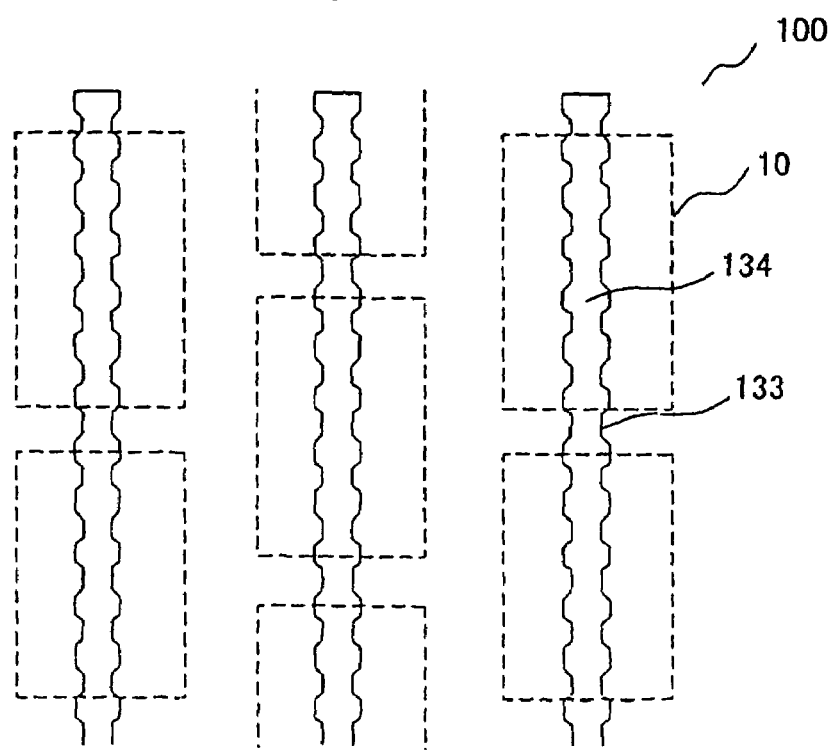
Figure 9:
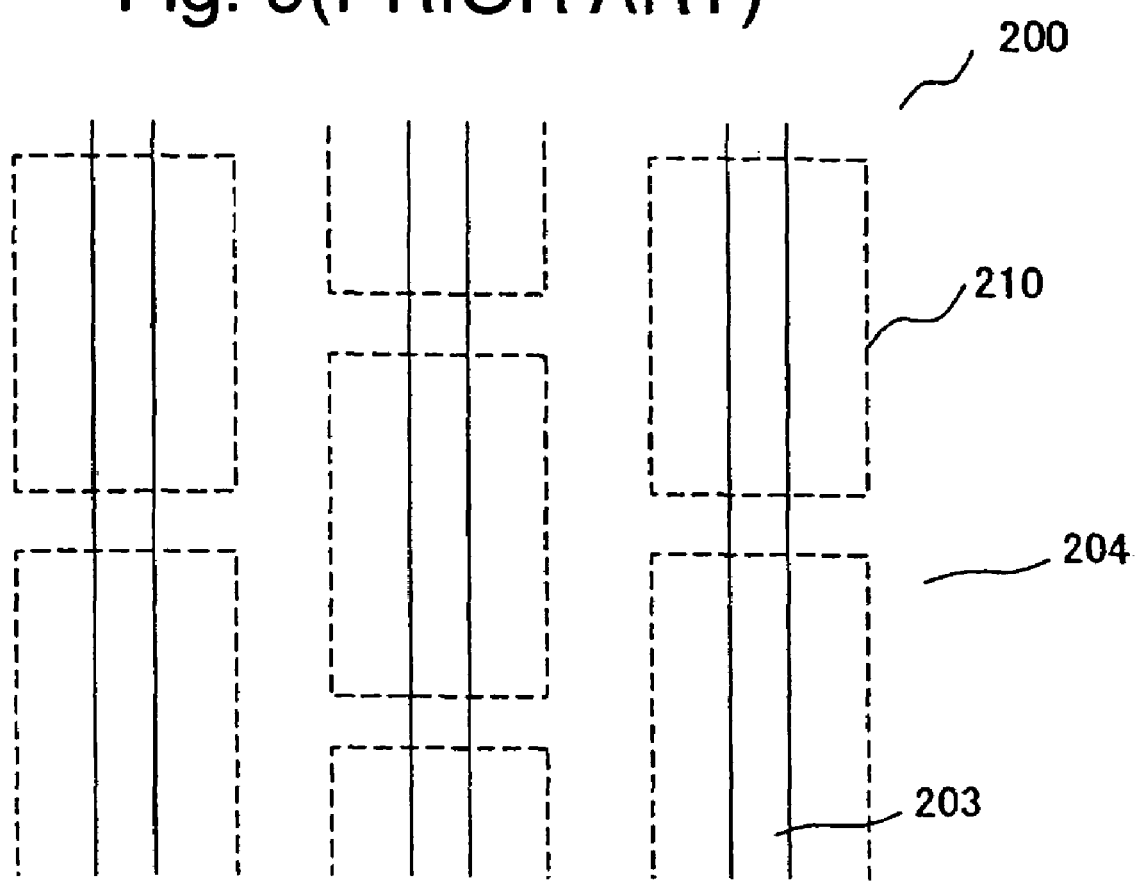
Figure 10:
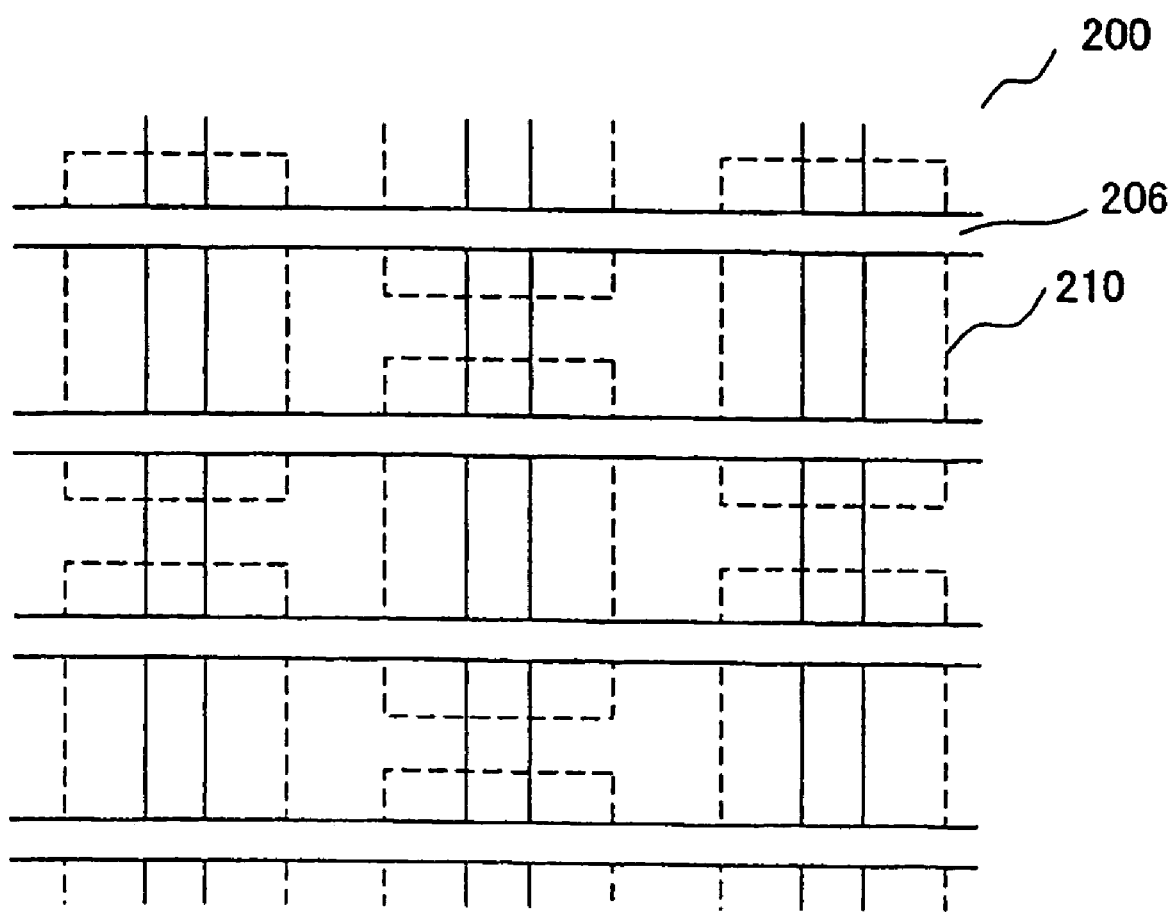
Figure 11A:
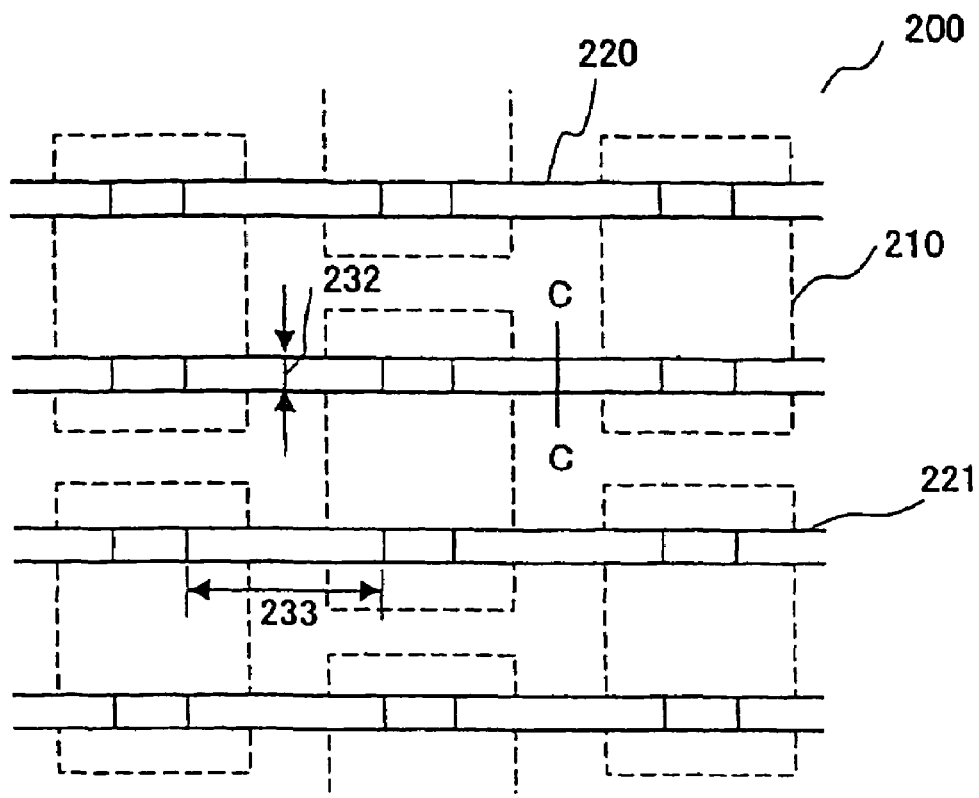
Figure 11B:
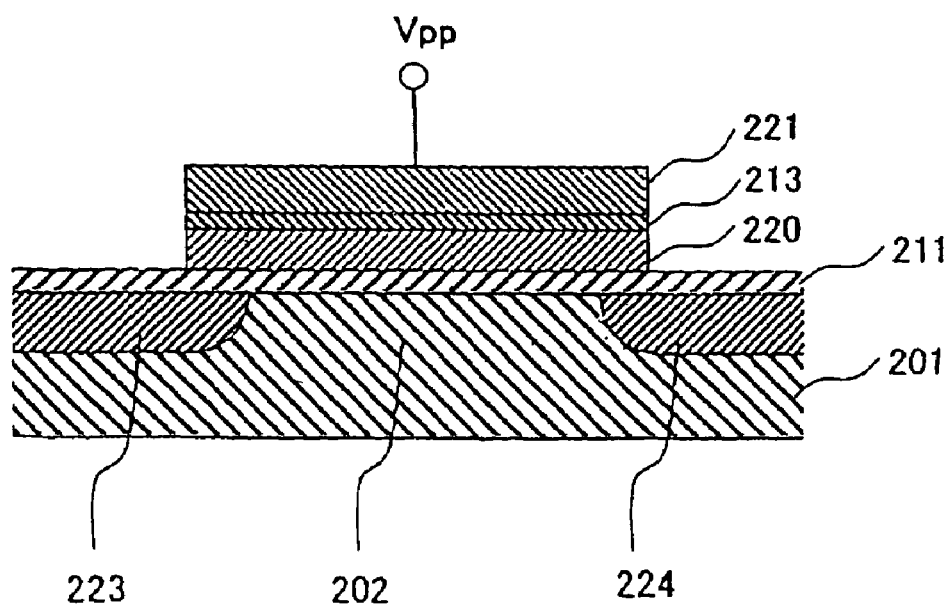
Figure 12:
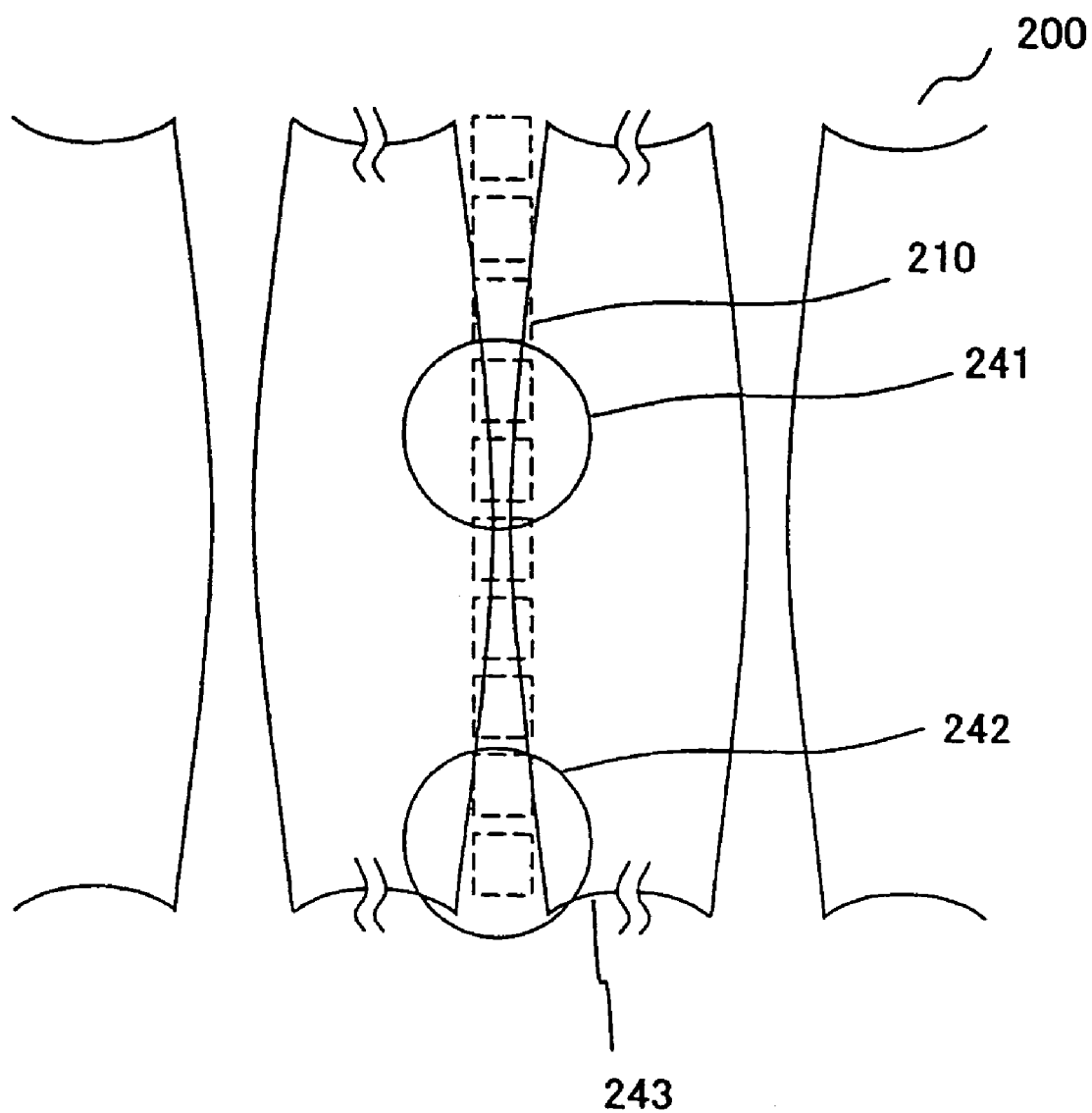

FIG. 4 is a schematic plan view of another resist pattern after development according to the first embodiment at the time of etching a polysilicon film formed across the memory cell section, FIGS. 5A and 5B are schematic illustrations of a second embodiment of a resist pattern according to the invention at the time of etching a polysilicon film formed across a memory cell section, and FIG. 5A is a schematic plan view of the resist pattern after development while FIG. 5B is a schematic plan view of the resist pattern after thermal flow treatment;

FIG. 6 is a schematic plan view of another resist pattern after development according to the second embodiment at the time of etching a polysilicon film formed across the memory cell section, FIG. 7 is an enlarged view of a part P in FIG. 5B;

FIGS. 8A and 8B are schematic illustrations of a third embodiment of a resist pattern according to the invention at the time of etching a polysilicon film formed across a memory cell section, and FIG. 8A is a schematic plan view of the resist pattern after development while FIG. 8B is a schematic plan view of the resist pattern after thermal flow treatment;

FIG. 9 is a schematic plan view of a resist pattern according to conventional techniques at the time of etching a polysilicon film formed across a memory cell section;

FIG. 10 is a schematic plan view of a resist pattern according to the conventional techniques at the time of forming control gates in the memory cell section;

FIG. 11A is a schematic plan view of the memory cell section according to the conventional techniques after the fabrication of the memory cells, and FIG. 11B is a schematic sectional view of the memory cell, taken on line C—C in FIG. 11A; and FIG. 12 is a schematic plan view of the resist pattern according to the conventional techniques after thermal flow treatment at the time of etching the polysilicon film formed across the memory cell section

PREFERRED EMBODIMENTS OF THE INVENTION

Referring to the accompanying drawings, embodiments of a method of fabricating a semiconductor device according to the invention are described in detail hereinafter. In the present specification and the drawings, constituent elements having identical function and configuration are denoted by like reference numerals, thereby omitting duplication in description.

First Embodiment

Figure 1A:
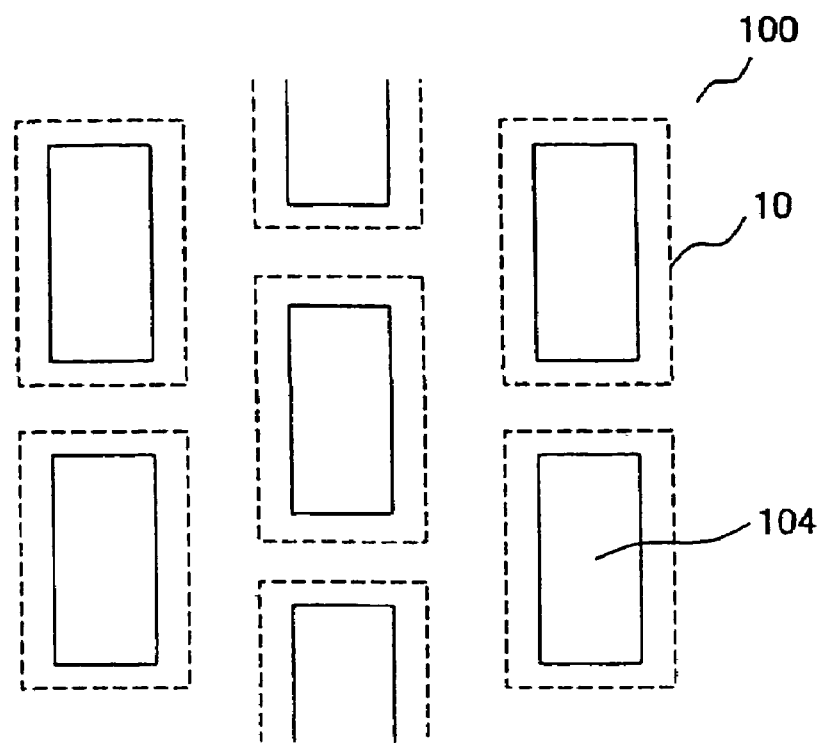
FIGS. 1A and 1B are schematic illustrations of a first embodiment of a resist pattern according to the invention at the time of etching a polysilicon film formed across a memory cell section.
Figure 1B:
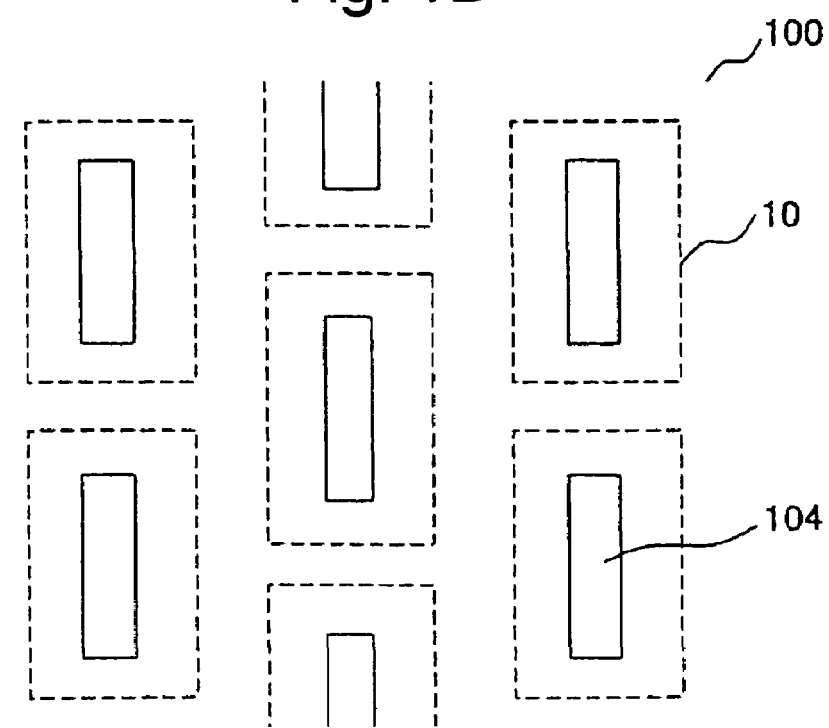
Figure 2:
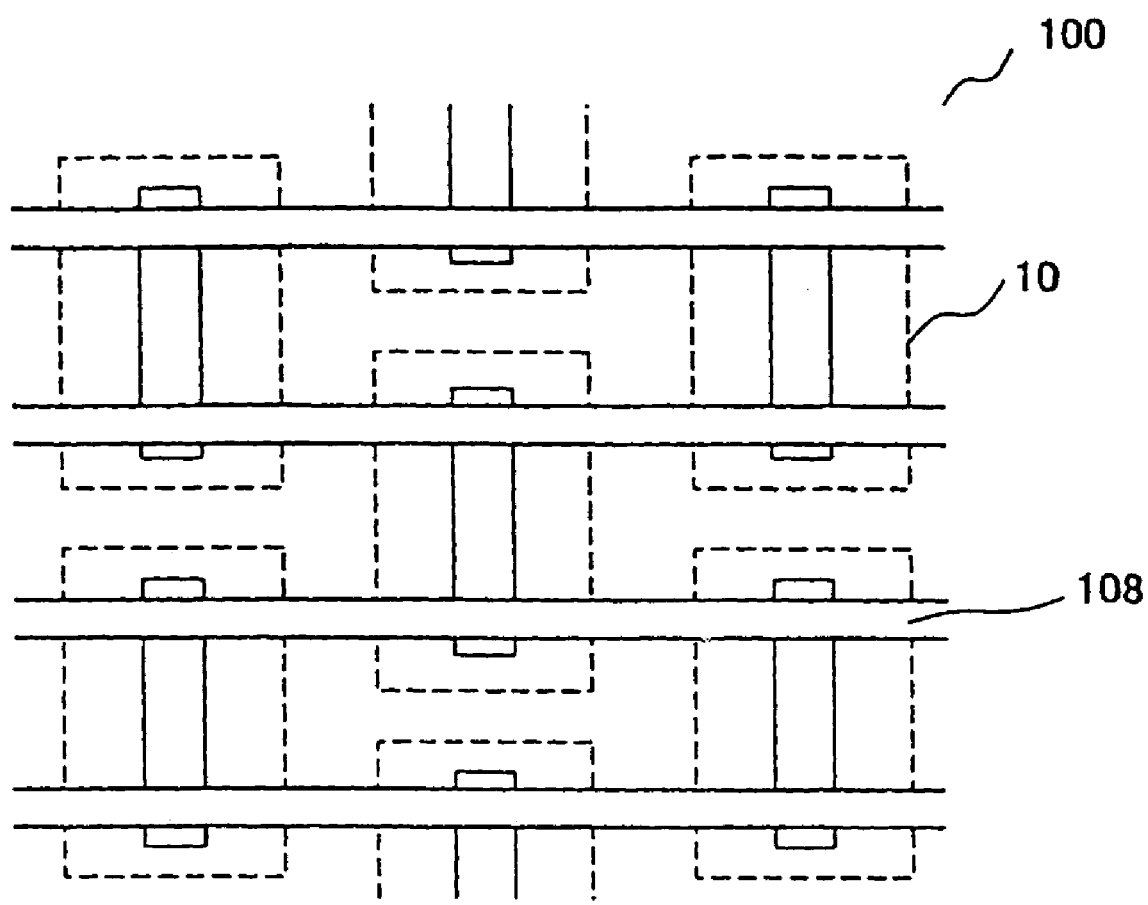
FIG. 2 is a schematic plan view of a resist pattern according to the first embodiment of the invention at the time of forming control gates in the memory cell section.

Referring to FIGS. 1 through 3, a first embodiment of the invention is described by taking an EEPROM wherein a memory cell section is made up by use of a repetitive pattern of one memory cell by way of example. Isolation between elements is effected on top of a substrate 101, thereby forming isolation oxide films 10 thereon. A pattern for the isolation oxide film 10 represents an isolation pattern covering two of the memory cells adjacent to each other, along the direction of the longer sides of the pattern. Subsequently, a gate oxide 11 and a polysilicon film 12 as an electrically conductive film to serve as floating gates are formed across the surface of the substrate 101.

Thereafter, a positive resist for KrF, suitable for fine patterning, is applied to the polysilicon film 12. In order to form end faces of the floating gates, in the longitudinal direction thereof, in a first stage of forming the floating gates, the resist is subjected to exposure with a KrF excimer laser exposure system using a mask pattern as desired, and is developed in an alkaline aqueous solution, thereby forming a resist pattern comprising the patterns for the isolation oxide film 10, each having an opening 103, for example, in the central part thereof, the opening 103 having a width corresponding to the resolution limit of the exposure system as shown in FIG. 1A. In this case, the opening is a portion of the resist where the resist becomes soluble due to the exposure and development to thereby expose an underlying surface.

Thereafter, post-baking with a hot plate is performed. The post-baking is performed at a post-baking temperature higher than a temperature (about 90° C.) for the purpose of removal of resist solvent and moisture as practiced in the past. The post-baking temperature is a temperature at which thermal flow (fluidity of the resist, due to heating, thermal sagging) is caused to occur to the resist pattern. Because of the thermal flow occurring to the resist, due to appropriate heating, left-out portions of the resist pattern, greater in area, are expanded, so that the openings undergo contraction.

With the use of the thermal flow, the openings can be rendered such that a width thereof becomes less in size than the resolution limit of the exposure system. As a resist having such properties as described, there is available, for example, TDUR-PO15 (trade name) manufactured by Tokyo Applied Chemical Co., Ltd. Further, the post-baking temperature is a factor determining an amount of deformation and deformed shape, due to the thermal flow, and a temperature around 135° C. is a temperature suitable for causing the thermal flow to occur in the case of the present embodiment.

As a result of treatment with the post-baking at high temperature, the openings 103 of the resist after development undergo deformation due to contraction to be thereby turned into openings 104 shown in FIG. 1B. Further, a widthwise dimension of the opening 103 after the development needs to be such a dimension as will not allow the opening 104 to be collapsed and closed as a result of the contraction due to the thermal flow.

With the conventional resist pattern for etching of the polysilicon film, since a large pattern (line and space pattern), having striped spacing portions where a resist is removed and striped left-out portions where the resist remains, used to be formed throughout a memory cell section 100, an amount of thermal sagging of portions of the resist, in the neighborhood of the middle parts of the memory cell section 100, differed from that of portions of the resist, in the neighborhood of the edges thereof, upon the thermal flow treatment applied, so that patterns for respective memory cells have not turned out uniform. Accordingly, the conventional resist pattern was not applicable for finer patterning. With the present embodiment, however, since the openings as small in longitudinal dimension as just cover two of the memory cells are formed, similar thermal sagging occurs to the respective openings upon the thermal flow treatment, so that it is possible to cause uniform deformation and contraction in pattern to occur to the respective memory cells within the memory cell section 100. The openings each are preferably formed such that a dimension thereof in the longitudinal direction thereof (in the direction orthogonal to the widthwise direction of the floating gate) is, for example, less than a length crossing two of control gates to be formed later at right angles.

To give a specific example of numerical values in connection with the resist pattern according to the present embodiment, if the opening 103 is formed such that a spacing width thereof is on the order of 1.5 μm substantially corresponding to the resolution limit of the exposure system, a spacing width of the opening 104 after the thermal flow can be contracted to the order of 0.07 μm. It follows that a gate width of the floating gate can be enlarged by about 0.07 μm above the conventional exposure resolution limit value.

Thereafter, by etching portions of the polysilicon film 12, in the respective openings 104, the end faces of the respective floating gates, along the direction of the gate width thereof, are formed, and an insulating film 13 is subsequently formed across the surface of the substrate, followed by the formation of, for example, a tungsten film 14 across the surface of the substrate in order to form the control gates 21. A resist pattern shown in FIG. 2 is transferred to the top of the tungsten film 14 by photolithography. Then, the tungsten film 14 is etched by use of resist left-out portions 108 as masks, thereby forming the control gates 21 each extending in the direction of the gate width of each of the floating gates.

Figure 3A:
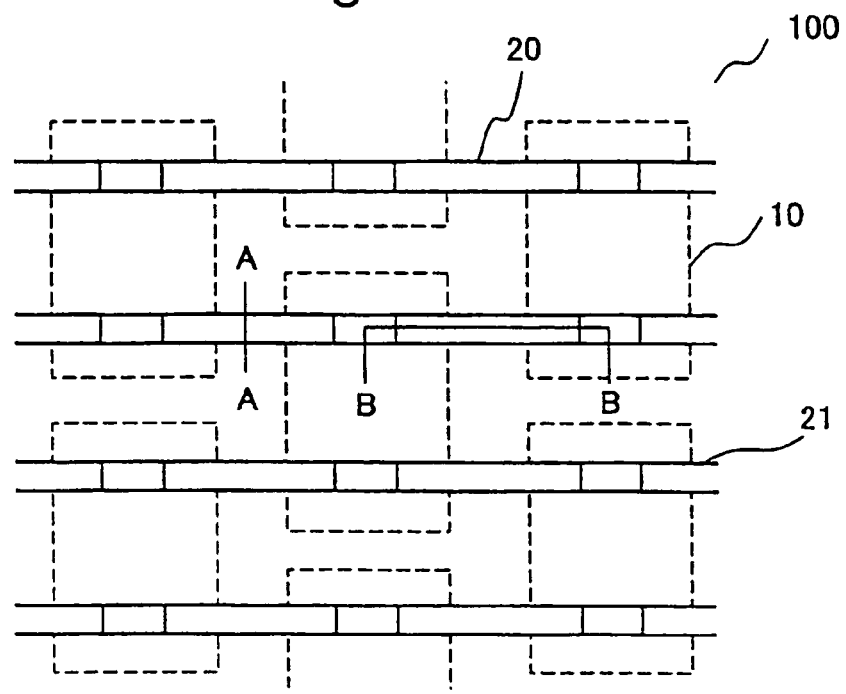
FIGS. 3A to 3C are schematic illustrations showing the memory cell section according to the first embodiment of the invention after the formation of floating gates.
Figure 3B:
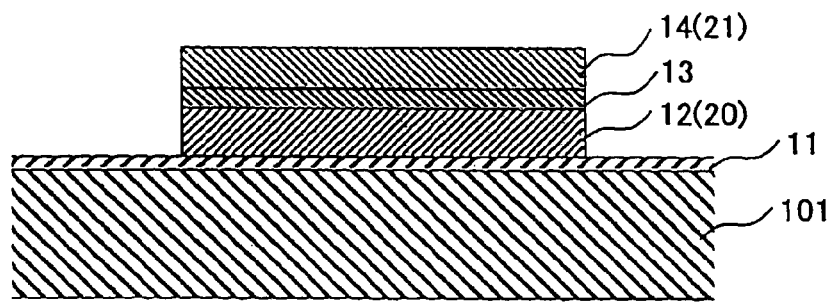
Figure 3C:
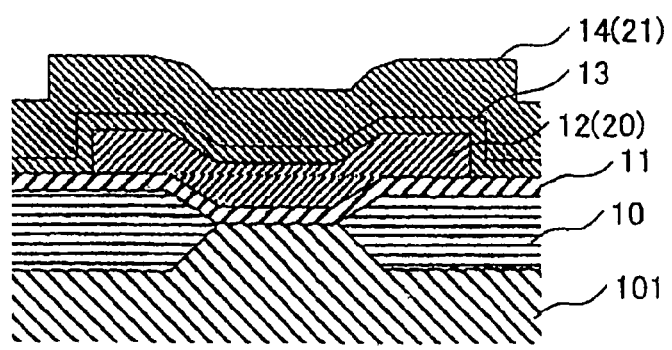

After the formation of the control gates 21, in a second stage of forming the floating gates, end faces of the respective floating gates, along the direction of a gate length thereof, are formed by etching the polysilicon film using the control gates 21 as masks in order to form the floating gate 20 only under the respective control gates 21, thereby completing the respective floating gates 20. FIG. 3A is a schematic plan view showing the memory cell section 100 after the formation of the floating gates 20, and FIG. 3B is a schematic sectional view taken on line A—A in FIG. 3A while FIG. 3C is a schematic sectional view taken on line B—B in FIG. 3A.

Further, by applying treatment such as ion implantation into a source region and drain region, respectively, with the respective control gates 21 interposed therebetween, there are fabricated the respective semiconductor memory cells wherein the control gate, floating gate, source, and drain are formed, respectively. Thereafter, there are further performed the formation of an insulating film, formation of contact holes, metallization, and so forth, thereby completing the memory cell section in its entirety.

Further, in the step of forming the resist pattern for etching the polysilicon film, the resist pattern used to be formed across the memory cell section in the conventional case, however, with the present embodiment, since a plurality of the openings are formed in the resist pattern, polysilicon-film-remaining portions after the etching differs from those in the conventional case. However, in an etching step at the time of forming the floating gates 20 after the formation of the control gates 21, all the polysilicon film 12 except the portions thereof, under the respective control gates 21, is etched away, there is no change in the shape of the memory cells after completion thereof.

With the present embodiment, the openings of the resist pattern are formed in the central part of the respective patterns of the isolation oxide films for forming the floating gate on both sides of the respective openings, however, an shown in FIG. 4, openings 105 each extending over two of the patterns of the isolation oxide films may be formed instead. Alternatively, for example, two openings (not shown in the figure) may be formed in each of the patterns of the isolation oxide films. In either case, similar thermal sagging occurs to the respective openings at the time of the thermal flow treatment, so that it is possible to cause uniform deformation in pattern to occur to the respective memory cells within the memory cell section 100. Further, a difference in the polysilicon-film-remaining portions due to a difference in the respective locations of the openings will pose no problem because such a difference will be eliminated by the etching in back-end process steps as previously described.

FIGS. 1A, 2B, 2, and 4 show that the resist openings 103, 104, or 105 are deployed in a rectangular matrix array. The drawing also shows that each respective opening 103, 104, or 105 of the resist pattern is slit-like with a longitudinal direction (vertical in FIGS. 1A, IB, 2, and 4) crossing a respective control gate at right angles (e.g., control gate 21 in FIG. 3A), and the plurality of openings is deployed along the direction perpendicular to the direction along which the respective control gates extend in the respective memory cells.

Thus, with the present embodiment, since the openings in slit-like form are formed instead of forming the resist pattern having the openings in stripe-like shape formed across the memory cell section in its entirety at the time of forming the floating gates, effects of pattern contraction due to the thermal flow occur evenly to the respective openings, thereby enabling a width thereof to be less than the resolution limit value of the exposure system. As a result, spacing between the floating gates formed on the both sides of the respective openings can be narrowed down, so that it is possible to enlarge the gate width of the respective floating gates. According to calculation, the area of the floating gate, opposite to the control gate, can be increased by about 30%.

Second Embodiment

With the first embodiment of the invention, use is made of a method of narrowing down the spacing between the floating gates by causing the respective openings of the resist to undergo deformation due to contraction by the agency of the thermal flow, however, with the present embodiment, use is made of a method whereby a group of openings are disposed at a plurality of spots, respectively, with a desired spacing provided therebetween, the openings are linked with each other after deformation due to thermal flow, and minute openings are formed in respective linkage parts, thereby narrowing down a spacing between the floating gates.

As with the first embodiment, for example, a positive resist for KrF is applied to a polysilicon film, and a resist pattern shown in FIG. 5A is formed in order to form end faces of respective floating gates, along the direction of a gate width thereof. As the group of the openings, for example, openings 121, 122, 123, apart from each other, with a resist left-out portion 124 interposed therebetween, respectively, are disposed in the central part of respective isolation oxide films 10.

Thereafter, as with the first embodiment of the invention, thermal flow treatment at temperature (about 135° C.) higher than that for the conventional method is applied to the resist after development as post baking. As a result, the resist is fluidized, and the openings 121, 122, 123 of the resist pattern shown in FIG. 5A are linked with each other to thereby form an opening 126 as shown in FIG. 5B. This occurs because when a resist left-out portion, wider in area, undergoes expansion, the resist left-out portions 124, in strip-like form, are fluidized as if absorbed by the resist left-out portion, wider in area, and linkage spots 127 of the respective openings 126 have a minute opening width above the resolution limit of an exposure system.

Subsequently, portions of the polysilicon film, in the respective openings 126, are etched, and a control gate is formed in the upper part of the respective linkage spots 127 as with the case of the first embodiment, thereby completing memory cells.

To give a specific example of numerical values in connection with the resist pattern after development, the respective resist left-out portions 124 preferably have a pattern width L1 of such magnitude as the openings 121, 122, and 123 can be linked with each other after thermal flow treatment, corresponding to about half of a desirable size of respective control gates to be formed later, that is, in a range of about 0.03 to 0.04 μm.

FIG. 7 is an enlarged view of a part P in FIG. 5B. A portion of the resist, triangular in shape, remains in the respective linkage parts of the respective openings, and an area of a floating gate pattern-forming region 129 is enlarged by a shaded area indicated by diagonals 130, so that an area of the floating gate, opposite to the control gate, can be enlarged further by about 10% over that for the first embodiment.

Further, as shown in FIG. 6, a plurality of resist left-out portions may be formed on both sides of respective isolation oxide films, in the longitudinal direction thereof. In such a case, the resist left-out portions 124' preferably have a pattern width L2 on the order of 0.01 μm in order to link respective openings with each other, in which case the formation of a mask pattern becomes difficult to implement, however, it becomes possible to further reduce an opening width at the linkage parts.

As described in the foregoing, with the present embodiment, the group of the openings partitioned from each other with the minute resist left-out portion interposed therebetween, respectively, are caused to undergo deformation to be thereby linked with each other. The linkage parts of the respective openings come to have a minute resist opening width above the resolution limit of the exposure system, and by etching the polysilicon film with the use of such a minute resist opening width, the floating gates are formed, thereby enabling the area of the floating gate, opposite to the control gate, to be enlarged further over that for the first embodiment.

Third Embodiment

The third embodiment is concerned with a method whereby successive opening columns are formed in the same resist pattern across a memory cell section in its entirety as that for the method of forming the resist pattern according to the second embodiment, whereby the respective linkage parts having the minute opening width are formed by linking the openings with each other by the thermal flow treatment.

First, a resist pattern shown in FIG. 8A is formed by use of, for example, a positive resist for KrF. The successive opening columns 131 are formed and juxtaposed across the memory cell section in its entirety.

Thereafter, thermal flow treatment at about 135° C. is applied to the resist, whereupon the resist is fluidized as with the second embodiment of the invention, and respective resist left-out portions are removed, thereby causing all openings of the successive opening columns 131 of the resist pattern shown in FIG. 8A to be linked with each other so as to form openings 134 each in the shape of a stripe delineated by lines with bumps and dips as shown in FIG. 8B. With the present embodiment, the resist pattern is spread across the memory cell section in its entirety, but a plurality of the openings 134 are juxtaposed, and deformation due to thermal flow occurs to each of the openings, so that the openings 134 are uniform in shape throughout the memory cell section.

Resist left-out portions 132 of the successive opening column 131 after development have a width L3 in size suitable for linking the original openings with each other after the thermal flow as with the second embodiment, preferably corresponding to about half of a desirable size of respective control gates to be formed later, that is, in a range of about 0.03 to 0.04 µm. Linkage spots 133 of the respective openings 134 formed after linkage have a minute opening width above the resolution limit of an exposure system.

With the present embodiment, since there are formed the opening columns wherein the resist is fluidized due to the thermal flow treatment to thereby link the original openings together, it is possible to obtain advantageous effects of narrowing down a spacing between floating gates and enlarging an area of the floating gate, opposite to a control gate as with the second embodiment. Further, with the second embodiment, since the control gate needs to be formed in the upper part of the respective linkage spots, high alignment accuracy is required in the step of forming the control gates. The present embodiment, however, is advantageous in that there is allowance for alignment accuracy because the linkage spots are continuously arranged in lines throughout the memory cell section.

While the preferred embodiments of the method of fabricating the semiconductor device according to the invention have been described hereinabove with reference to the accompanying drawings, it is to be understood that the scope of the invention is not limited thereto. It will be obvious that various changes and modifications may occur to those skilled in the art without departing from the spirit or scope of the following claims, and it is to be understood that all such changes and modifications should be considered to be within the scope of the invention.

As described hereinbefore, with the method of fabricating the semiconductor device according to the invention, as for the resist pattern for determining the spacing between the floating gates adjacent to each other at the time of forming the floating gates of the memory device, the openings in small slit-like shape are formed, uniform contraction due to the thermal flow is caused to occur to the opening width of the respective openings, and the spacing between the floating gates adjacent to each other is rendered less than a limit value imposed by photolithographic techniques to thereby enlarge the floating gate width. As a result, the area of the floating gate, opposite to the control gate can be increased, so that it becomes possible to enhance the write efficiency of the memory.

What is claimed is:

1. A method of fabricating a semiconductor device made up of memory cells each having a control gate formed above a floating gate, said method comprising steps of:
    forming a resist pattern having a plurality of openings on an electrically conductive film, serving as the floating gates, formed across a substrate;
    baking the resist pattern to thereby cause deformation due to thermal flow to occur thereto and causing the openings to undergo contraction;
    etching a portion of the electrically conductive film, in the respective openings after the contraction, and forming end faces of the respective floating gates, along the direction of a gate width thereof;
    forming the control gate, extended in the direction of the gate width of the respective floating gates, above a portion of the electrically conductive film, defining the end faces of the respective floating gates, with an insulating film interposed therebetween; and
    selectively etching the electrically conductive film using the control gates as masks to thereby form the floating gate under the respective control gates;
    wherein each respective opening of the resist pattern is slit-like with a longitudinal direction thereof crossing a respective control gate at right angles, and wherein the openings are deployed along the direction perpendicular to the direction along which the respective control gates extend in the respective memory cells.

2. A method of fabricating a semiconductor device according to claim 1, wherein the respective openings of the resist pattern have a length along the longitudinal direction thereof such that the respective openings cross two control gates or less.

3. A method of fabricating a semiconductor device according to claim 1, wherein a length of the respective openings of the resist pattern, along the widthwise direction thereof, is a length corresponding to the resolution limit of a pattern exposure system.

4. A method of fabricating a semiconductor device according to claim 1, wherein a baking temperature for the resist pattern is about 135° C.

5. A method of fabricating a semiconductor device according to claim 1, wherein the openings are deployed in a rectangular matrix array.

* * * * *